United States Patent [19]

Swanson

[11] 4,403,197
[45] Sep. 6, 1983

[54] AMPLIFIER EMPLOYING DIGITAL MODULATOR CIRCUIT

[75] Inventor: Hilmer I. Swanson, Quincy, Ill.

[73] Assignee: Harris Corporation, Melbourne, Fla.

[21] Appl. No.: 314,863

[22] Filed: Oct. 26, 1981

Related U.S. Application Data

[63] Continuation of Ser. No. 98,749, Nov. 30, 1979, abandoned.

[51] Int. Cl.$^3$ .............................................. H03F 3/38
[52] U.S. Cl. ..................................... 330/10; 455/108
[58] Field of Search ..................... 330/10, 202, 207 A, 330/251, 297; 455/108

[56] References Cited

U.S. PATENT DOCUMENTS

| | | | |
|---|---|---|---|
| 3,100,851 | 8/1963 | Ross et al. | 307/107 |
| 3,577,092 | 5/1971 | Kubicz | 330/124 R |
| 3,705,391 | 12/1972 | Baker | 340/173 CA |
| 3,748,492 | 7/1973 | Baker | 307/117 |
| 3,867,643 | 2/1975 | Baker et al. | 307/151 |
| 4,016,501 | 4/1977 | Jasinski et al. | 330/10 |
| 4,153,882 | 5/1979 | Fisher et al. | 330/10 |
| 4,164,714 | 8/1979 | Swanson | 330/10 |
| 4,205,241 | 5/1980 | Fisher et al. | 330/10 |

Primary Examiner—James B. Mullins
Attorney, Agent, or Firm—Yount & Tarolli

[57] ABSTRACT

An amplifier (FIGS. 1-3) is disclosed for amplifying an amplitude and frequency varying input signal. The amplifier includes a circuit (24, 100) responsive to the input signal to provide a digital representation thereof. In addition, a plurality of signal sources (30-36) are provided which each provide an associated signal. Another circuit (38-52) combines selected ones of the associated signals in accordance with the digital representation to provide a first combined signal having substantially the same waveform as, but of greater amplitude than the input signal.

In several embodiments, a circuit (74, 76-78) provides an error signal in accordance with the difference between the desired and actual forms of the first signal. This error signal is combined with the first combined signal to derive an error corrected signal.

48 Claims, 7 Drawing Figures

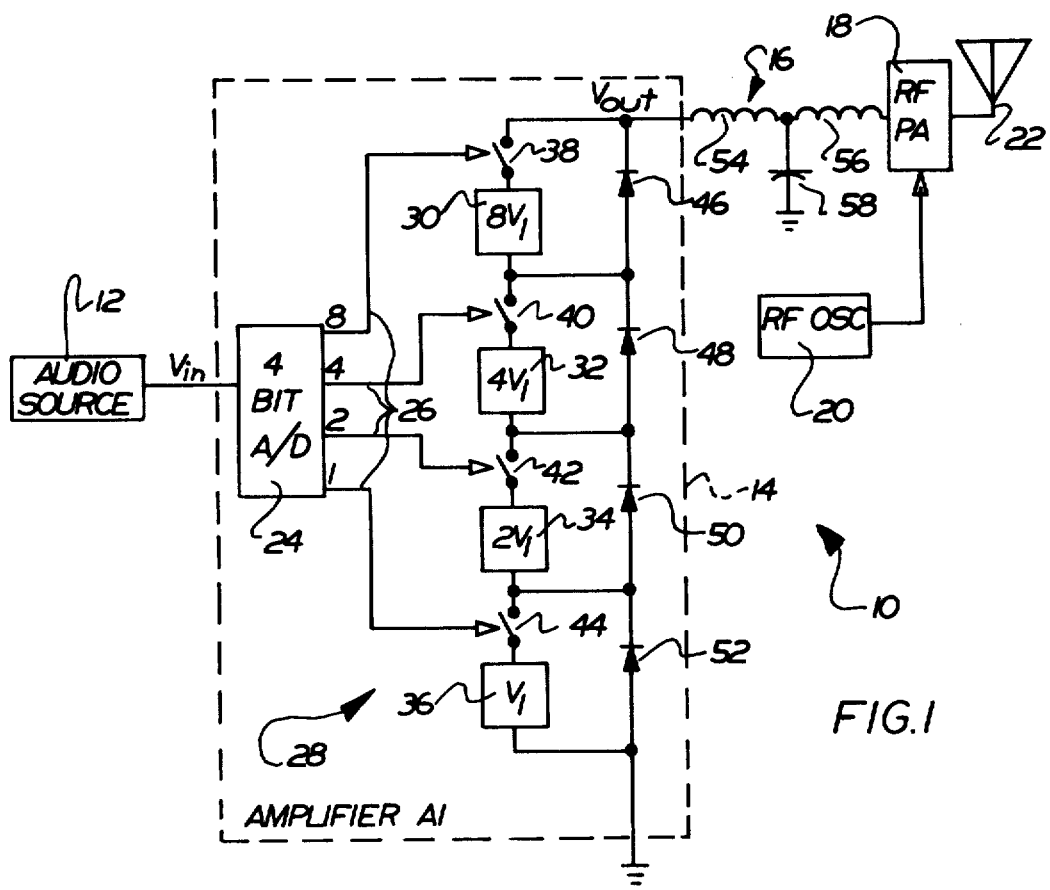
FIG.1
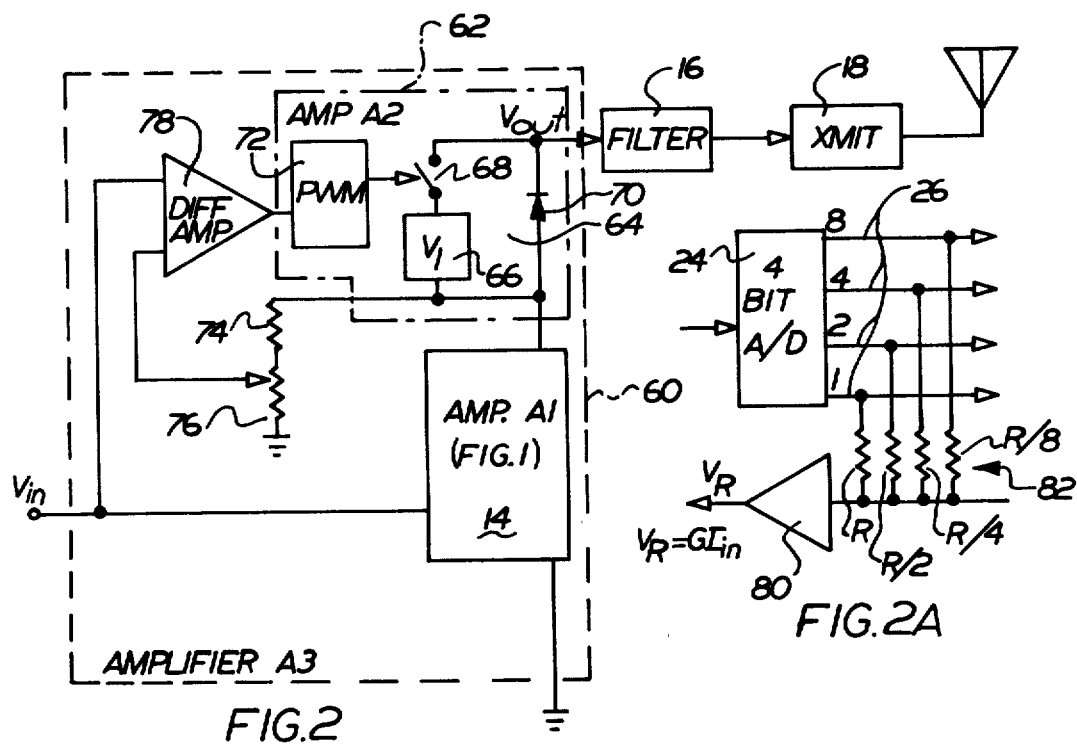
FIG.2
FIG.2A

AMPLIFIER EMPLOYING DIGITAL MODULATOR CIRCUIT

This is a continuation, of application Ser. No. 098,749 filed Nov. 30, 1979, and now abandoned.

BACKGROUND AND FIELD OF THE INVENTION

The present invention relates to amplifiers, and more particularly to an amplifier employing digital switching of incremental signal sources for amplifying an amplitude and frequency varying input signal to high power levels.

In amplifier design, one important consideration is the efficiency at which the amplifier operates. Other important considerations include reliability, size, etc. It may be well appreciated that these considerations assume exaggerated importance in very high power amplifiers, such as those used in the modulating circuits of conventional broadcast transmitters. These audio amplifiers must amplify an input audio signal up to a power level ranging from several kilowatts to several tens of kilowatts.

An additional consideration in the selection of an amplifier design is the compatibility of that design with available solid state devices. Solid state devices, such as transistors, VFETs, SCR's, etc. are preferred over vacuum tube devices in view of their size, relative efficiency, and reliability. Unfortunately, such solid state devices as are readily available do not generally have sufficient power handling capabilities for use in standard very high power amplifier designs.

In the prior art, pulse duration modulation has been used effectively in increasing the efficiency of these high power amplifiers. Thus, as shown in the patent to Swanson, U.S. Pat. No. 3,506,920, high power amplification may be obtained by pulse width modulating a carrier signal in accordance with the changing level of an audio signal, amplifying the resulting bi-level pulse waveform, and then recovering an amplified audio signal by filtering the resulting amplified PDM signal. Even with these PDM amplifiers, however, no entirely satisfactory design has been found which employs high powered solid state devices in view of the existing limitations on power and speed of these devices.

One approach which has been taken in order to resolve this incompatibility is described in the patent to Swanson, U.S. Pat. No. 4,164,714, entitled "Polyphase PDM Amplifier". The amplifier described in this patent receives a time varying input signal and converts it into a plurality of modulated pulse trains of like polarity and frequency (each of which may, for example, be a PDM signal) and which are phase displaced from one another by a known amount. The pulse trains are combined to form a composite signal of increased magnitude and of substantially the same waveform as the input signal. Unlike previous PDM amplifiers, the design of this Polyphase PDM amplifier has been found to be compatible with existing solid state devices.

SUMMARY OF THE INVENTION

It is a general object of the present invention to provide an improved high power amplifier.

It is another object of the present invention to provide a high power amplifier whose design is compatible for use with conventional solid state elements.

It is yet another object of the present invention to provide an amplifier for providing power amplification with high efficiency.

It is still another object of the present invention to provide an amplifier which performs in accordance with the objects set forth above, and which has reduced output filtering requirement.

It is a further object of the present invention to provide an amplifier for use in an RF amplitude modulation system which achieves the foregoing objects.

In accordance with one aspect of the present invention, an amplifier is provided for amplifying an amplitude and frequency varying input signal. The amplifier includes means responsive to the input signal to provide a digital representation thereof. A plurality of signal sources are provided which each provide an associated signal. Combining means combines selected ones of these associated signals in accordance with the digital representation to provide a first combined signal having substantially the same waveform as, but of greater magnitude than, the input signal.

In accordance with another aspect of the present invention, means are further included for providing an error signal which varies in accordance with the difference between the desired and actual forms of the first combined signal. This error signal is combined with the first combined signal to form an error-corrected first combined signal.

More specifically, there is disclosed hereinafter an amplifier including a converter which is responsive to the amplitude and frequency varying input signal to provide a digital word including plural bits which together indicate and change with the analog level of the amplitude and frequency varying input signal. Each of the bits of this word has an assigned value representing its contribution to the total signal. Means are further provided responsive to this digital word for reconstructing the input signal in amplified form. This means comprises a plurality of incremental voltage sources, each having a value corresponding to the value assigned to the corresponding one of the bit positions of the individual words. A plurality of switching means are also incorporated in the reconstructing means, each associated with a corresponding one of the incremental voltage sources. Each of the switching means has at least two selectable states. In the first state the associated incremental voltage source is interconnected in series with the other selected voltage sources across the output, whereas in the other state the associated incremental voltage source is disconnected from the output. The state of each of the switching means is selected by the bit in the corresponding bit position of the digital word.

In another of the described embodiments of the present invention, the amplifier as defined above includes a pulse duration modulation stage for adding an incremental pulse duration modulated (PDM) signal onto the reconstructed analog signal, wherein the width of the pulses in the PDM carrier signal are modulated in accordance with the difference between the reconstructed signal and the input signal. A sum signal is then provided corresponding to the additive sum of this PDM signal and the reconstructed analog signal.

BRIEF DESCRIPTION OF THE DRAWINGS

The foregoing and other aspects and advantages of the present invention will become more readily apparent from the following detailed description, as taken in conjunction with the accompanying drawings, wherein:

FIG. 1 is a block diagramatic representation of one embodiment of an amplifier in accordance with the teachings of the present invention;

FIG. 2 is a block diagram of another embodiment of an amplifier in accordance with the teachings of the present invention, wherein a PDM stage has been added;

FIGS. 2A and is a block diagram of an alternative embodiment of a portion of the amplifier of FIG. 2;

DETAILED DESCRIPTION

Figure 3:
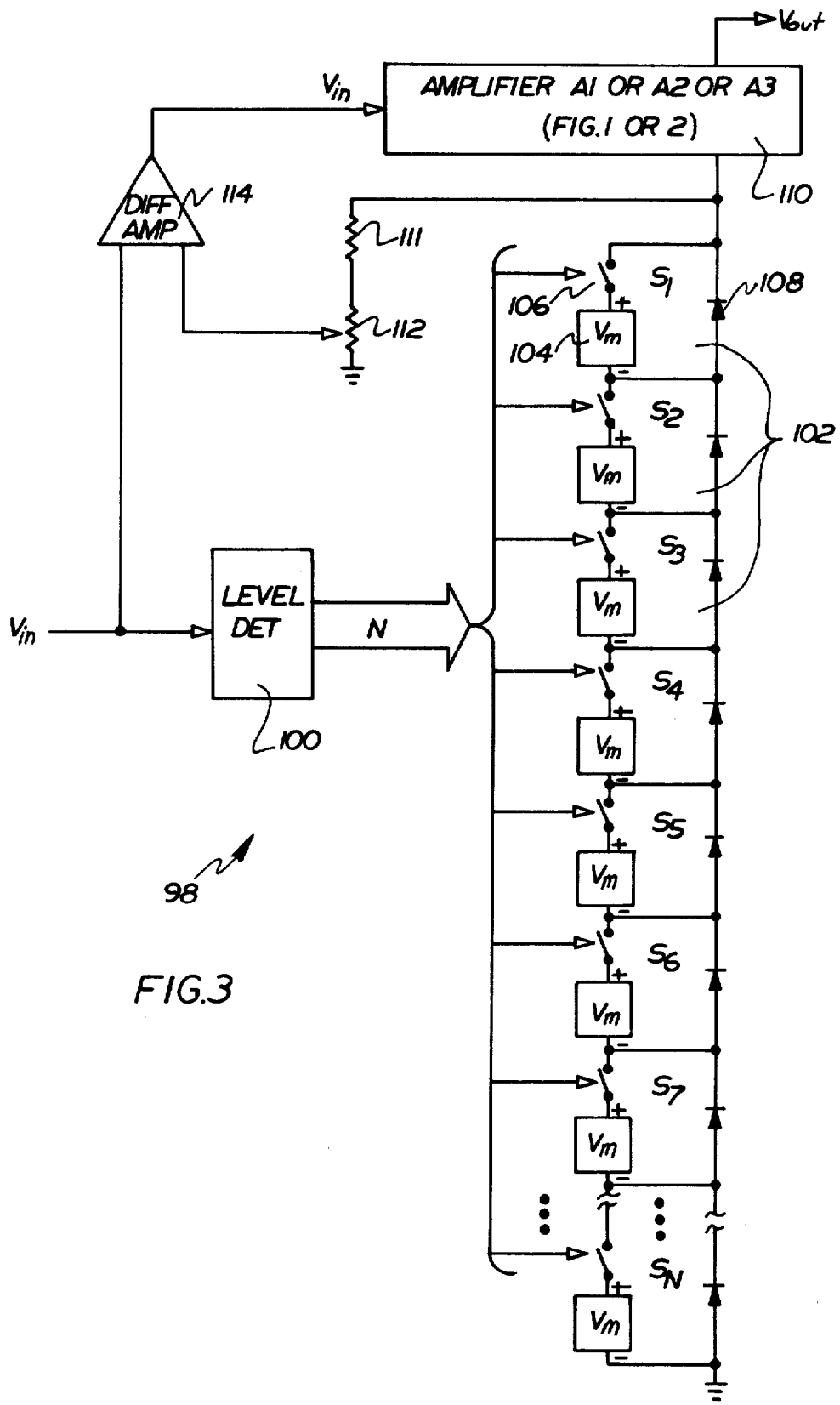
FIG. 3 is a block diagram of a third embodiment of the present invention.

In the following description, the invention will largely be described with respect to an ampifier used in the RF modulation stage of a conventional AM transmitter. This specific embodiment is utilized for exemplary purposes only, however, and it should be appreciated that the amplifier described hereinafter will find extensive use in many applications wherein high power amplification of an amplitude and frequency varying input signal is required.

Referring now to FIG. 1, there is illustrated an AM transmitter incorporating an amplifier in accordance with the teachings of the present invention. In this figure, a transmitter system 10 includes an audio signal source 12 which generates the amplitude and frequency varying audio signal which is to be transmitted. This audio signal ($V_{in}$) is supplied to an amplifier 14 which amplifies it to a high power level and provides the resulting amplitude signal ($V_{out}$) at its output to filter stage 16. The filter 16 removes out-of-band artifacts of the amplification process from the amplified signal. The resulting amplified and filtered signal is then supplied to the audio input of a conventional RF power amplifier 18 where it amplitude modulates an RF carrier supplied by an RF oscillator 20. The resulting AM signal is then transmitted over a conventional antenna or antenna array 22.

In accordance with the present invention, the amplifier 14 includes a circuit 24 to which the input signal is applied. This circuit 24 converts this amplitude and frequency varying input signal into a digital word comprised of plural individual bits, each provided upon a corresponding output line 26 at the output of the circuit 24. These bits together indicate the instantaneous level of the input audio signal to within an incremental limit, and change with time to indicate the changing level of the audio signal. In FIG. 1, the circuit 24 comprises a conventional analog-to-digital (A/D) converter. The digital word provided along the output line 26 therefore comprises a binary representation of the input signal, with the four bits provided along the four output lines 26 of converter 24 have a weighting of 8-4-2-1. This digital word will vary between a lower limit of "0000", to an upper limit of "1111" in accordance with changes in the instantaneous level of the audio signal $V_{in}$, and will have an average or D.C. value of "1000". For some A/D convertors, it may be necessary to D.C. bias the input signal at one half of the supply voltage to achieve this result.

The A/D convertor 24 may be either clocked (i.e., updates the value of the output digital word only upon a "convert" command) or unclocked (i.e., the output digital word continually reflects the value of the input analog signal). If the former, the conversion rate should be great enough that the output word essentially changes concurrently with any changes in the analog input signal.

The digital word provided along the line 26 at the output of A/D 24 is supplied to a circuit generally indicated at 28 whose purpose is to reconstruct the analog audio signal therefrom in amplified form. This reconstruction circuit 28 includes a plurality of incremental D.C. voltage sources 30, 32, 34, and 36. Each of the incremental voltage sources includes a switching circuit comprised of a corresponding switch 38, 40, 42 and 44, and a corresponding bypass diode 46, 48, 50 and 52. (For convenience of description, the combination of an incremental voltage source and its associated switching circuit and bypass diode will be referred to occasionally hereinafter as an amplifier "cell".) The level of D.C. voltage supplied by the various incremental voltage sources will be selected to correspond to the weighting of the individual bits provided at the output of the converter 24. Thus, in the embodiment illustrated in FIG. 1, the four incremental voltage sources 30, 32, 34 and 36 will have a weighting of 8-4-2-1, since the digital word is coded in binary form. Moreover, each source will "float" with respect to the other sources. Consequently, different output voltages can be formed by simply connecting the necessary voltage sources together in series.

The switching circuits associated with each of the incremental voltage sources are controlled by the bit having the corresponding value. At any given time, this bit can assume either of two possible values, a binary "0" or a "1". When the bit has one value, then the incremental voltage source will be connected in series with other selected incremental voltage sources across the load, in this case comprised of the filter circuit 16 and the RF power amplifier 18. When the bit has the second binary state, however, the switching circuit will instead disconnect the incremental voltage source from the output, so that the incremental voltage of that source provides no contribution to the composite signal appearing across the load.

Although, in FIG. 1, the switches 38-44 are illustrated as convention SPST mechanical switches, in a practical embodiment solid state switches, such as described hereinafter, will instead be used.

To better understand the operation of the reconstruction circuit 28, consider the amplifier cell including incremental voltage source 36 and its associated switching elements 44 and 52, which are exemplary of the remaining cells in the reconstruction circuit. In this amplifier cell, as in all others, the incremental voltage source 36 is connected in series with its associated switch 44, and in parallel with the bypassing diode 52. Furthermore, this cell is connected in series with all of the other cells in the reconstruction circuit 28. When the switch 44 is "open", then the voltage source 36 is disconnected and thus does not contribute to the total signal supplied at the output of the amplifier. The disconnection of the voltage source does not, however, interfere with the operation of the remaining incremental voltage sources, since the diode 52 provides a path for current to bypass the incremental voltage source 36, and thereby flow into the load connected to the output of the amplifier. When the switch 44 is "closed", however, then the voltage source 36 will effectively reverse bias the associated bypassing diode 52, and will instead connect the incremental voltage source 36 into a series combination with the remaining cells in the amplifier. Each of the incremental voltage sources 30–36 may thus be connected in series with any selected combination of the remaining incremental voltage sources.

At any given time, the ones of the voltage sources 30, 32, 34 and 36 connected in series across the output of the amplifier will be dependent strictly upon the binary word provided at the output of the A/D converter 24. If this binary word were, for example, "1011", then the voltage appearing across the load circuit would be 8 $V_1$ plus 2 $V_1$ plus $V_1$, or 11 $V_1$. Since each switching circuit has two possible states, there are a total of $2^4$, or sixteen different combinations of the incremental voltage sources possible. Consequently, there are sixteen different analog voltage levels which may be provided at the output, under the control of the digital signals provided by the A/D converter 24. Since the A/D converter 24 is controlled by the analog signal provided by audio signal source 12, and since the coding of the digital word is the same as the weighting of the incremental voltage sources, this output signal will mirror the input signal in a stepwise fashion. Because the size of the steps (equal to the smallest incremental voltage $V_1$), is dependent only on the magnitude of the voltages provided by the voltage sources, this output signal may be of much greater magnitude by appropriate scaling of these voltages.

Figure 6:
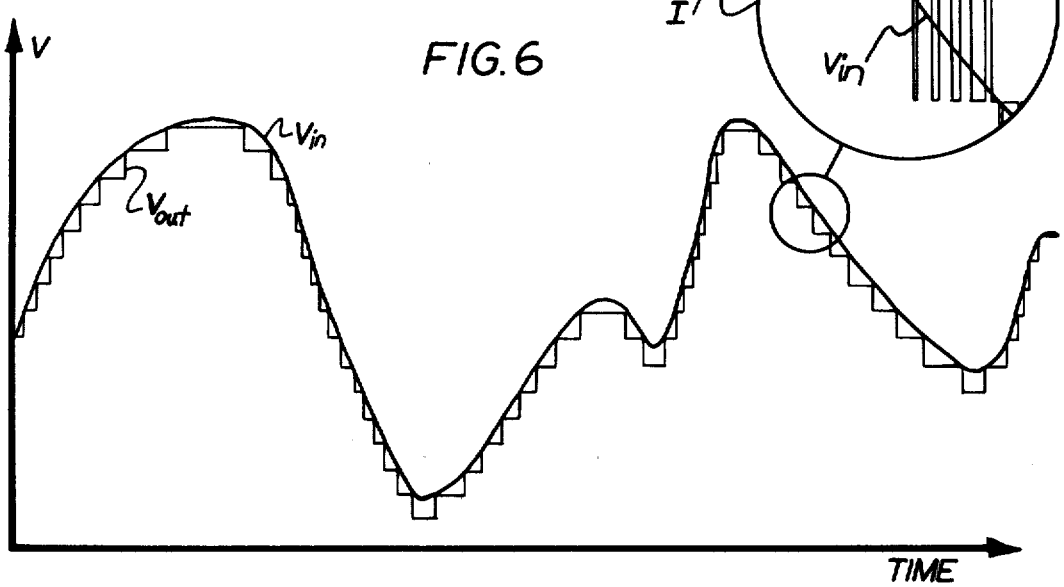
FIG. 6 is an illustration of a reconstructed analog waveform produced by an amplifier in accordance with the teachings of the present invention.

FIG. 6 illustrates an analog input signal $V_{in}$ and the output signal $V_{out}$ which the amplifier of FIG. 1 will provide in response thereto. Although, for convenience of illustration, $V_{in}$ and $V_{out}$ are shown as having approximately the same magnitude, the steps in $V_{out}$ will generally be very much larger, leading to significant voltage gain through amplifier 14.

As is apparent from FIG. 6, the reconstructed analog signal includes step transitions from each signal level to the next succeeding level, thereby introducing unwanted high frequency components to the reconstructed waveform. The filter 16, illustrated in FIG. 1 as a conventional T network comprised of inductors 54 and 56 and a capacitor 58, will be designed to filter out the high frequency components introduced by the step transitions, thereby smoothing the reconstructed waveform.

FIG. 2 illustrates an alternative embodiment of the amplifier of FIG. 1, incorporating a pulse width modulation (PWM) amplifier cell to provide improved resolution of the reconstructed waveform. In this circuit, the analog signal $V_{in}$ will again be provided by an analog signal source such as audio source 12 of FIG. 1. The amplifier will of course amplify this signal to provide an amplified signal to a load such as filter 16 and transmitter 18.

The amplifier 60 of FIG. 2 includes a first portion 14 which may be substantially identical to the amplifier 14 of FIG. 1. As stated previously, the reconstructed waveform provided at the output of the amplifier 14 will have stepwise transitions between the sixteen different levels thereof. A certain degree of inaccuracy of amplification arises from the finite number of steps in the output signal. Greater resolution of amplification could be provided by including an A/D converter 24 having greater resolution, such as 8, 10, or 12 bit resolutions, together with a correspondingly greater number of weighted amplifier cells. Presuming that the A/D converter provides a binary coded output and again presuming that the incremental voltage sources are weighted in corresponding fashion, the inclusion of each subsequent cell of amplification multiplies the total possible number of amplifier levels by a factor of 2. The use of an eight-bit A/D converter in conjunction with an eight-cell amplifier would therefore provide 256 possible analog levels at the output. At some point, however, a minimum step size will be found such that it will be impractical to provide cells including smaller incremental voltages. The amplifier 60 of FIG. 2 utilizes a PWM amplifier stage 62 to increase the resolution even beyond this limit.

The amplifier 62 includes an additional amplifier cell 64 which, as with the previous cells, incorporates an incremental voltage source 66, a switch 68, and a bypassing diode 70. In the embodiment illustrated in FIG. 2, the incremental voltage source 66 associated with the cell 64 has an output voltage which is equal to the difference in amplitude between adjacent voltage levels obtainable by the amplifier 14. Thus, if the amplifier 14 is constructed as the amplifier 14 of FIG. 1, then this voltage source 66 will provide the same incremental voltage as the voltage source 36. The switching of the incremental voltage source 66 into and out of the circuit is again accomplished by means of the solid state switch 68. Switch 68, however, is in this embodiment controlled by a pulse width modulator 72, which may take any conventional form (as disclosed, for example, in the aforementioned patent of Swanson, U.S. Pat. No. 4,164,714).

The pulse width modulator 72 has for its input an analog signal representing the difference between the reconstructed waveform generated by amplifier 14 (divided down to be of equal amplitude to the input signal) and the input signal $V_{in}$. To scale the reconstructed waveform down to be of the same gain as the input signal $V_{in}$, a resistive divider is provided comprised of a fixed resistor 74 in series with a potentiometer 76. The tap on the potentiometer 76 will be adjusted until the voltage appearing at the tap is of substantially the same scale as the analog signal provided to the input of the amplifier. A difference amplifier 78 will then subtract one from the other and will provide a signal at its output representative of the difference between the desired waveform (represented by the input signal $V_{in}$) and the actual reconstructed waveform, as derived from the tap on the potentiometer 76. The output of PWM 72 will be a pulse train, the pulses of which occur at an appropriate frequency (for example 100 kHz) and with a duty cycle ranging from 0% to 100% in direct dependence upon the amplitude of the signal provided by difference amplifier 78.

In operation, the voltage provided by the differential amplifier 78 will be very small or zero when the reconstructed waveform coincides exactly with the ideal waveform. In that case, the output signal provided by the pulse width modulator 72 will have a very small, or perhaps zero duty cycle, thus the switch 68 will remain open and the reconstructed waveform will pass through the amplifier 62 substantially without change. As the difference between the reconstructed waveform and the desired waveform becomes greater and greater, however, the duty cycle of the cyclical signal at the output of the pulse width modulator 72 will increase, thus switching the incremental voltage source at a corresponding duty cycle, and adding a PWM component to the output signal $V_{out}$. Just prior to amplifier 14 switching to the next successive amplitude level, the PWM waveform will have a nearly 100% duty cycle. Upon the switching of the amplifier 14 to the next successive level, of course, the difference between the desired amplitude and the actual amplitude will drop to substantially zero, causing the duty cycle of the pulse width modulator to similarly drop to zero. Since the cell 64 is connected essentially in series with the cells of the amplifier 14, the PWM signal is added into the reconstructed waveform in the same fashion as are the incremental voltages provided by the other cells in amplifier 14.

The insert I in FIG. 6 illustrates, on an expanded scale, the appearance of the output waveform $V_{out}$ for the amplifier of FIG. 2 when an input signal $V_{in}$ is applied thereto.

Although illustrated in FIG. 2 with the amplifier 62 interposed between the amplifier 14 and filter 16, the circuit could have as easily have been constructed with the amplifier 62 located between the last cell in amplifier 14 and ground. In this event, however, the scaled signal provided to the differential amplifier 76 would have to be derived in a different manner. For example, as shown in FIG. 2A the outputs 26 of A/D converter 24 of FIG. 1 could each be connected into a single, common input of a current amplifier 80 through corresponding resistors 82 so as to develop a current signal into the current amplifier which varies with the digital word provided on the output 26. By weighting the resistors 82 by factors of 1, $\frac{1}{2}$, $\frac{1}{4}$ and $\frac{1}{8}$, as illustrated, the total current going into the input of the amplifier can be made to correspond linearly with the magnitude of the reconstructed waveform appearing across the amplifier cells controlled by these outputs. The voltage output thereof would then correspond to the current input from the four lines 26, and hence would reflect the contribution to the reconstructed waveform provided by the amplifier 14. This voltage signal would then be provided to the input to differential amplifier 76 in place of the connection to the tap of potentiometer 74 in the embodiment of FIG. 2. The resulting operation will be essentially identical to the operation provided by the amplifier of FIG. 2.

In the embodiments illustrated in FIGS. 1 and 2, one of the incremental voltage sources will always have an incremental voltage equal to substantially half of the total voltage range over which the output signal may change. In FIG. 1, for example, the incremental voltage source 30 has a magnitude of 8 $V_1$, when the total voltage range is only 16 $V_1$. Although this will not represent a problem for many applications, it does represent a significant constraint in those applications requiring output voltages extending into the kilovolt range, and beyond. This is essentially because the solid state elements utilized to switch the incremental voltage sources are limited in the voltages which they can handle. Consequently, if the amplifier designs of FIGS. 1 and 2 were strictly followed, the total voltage range of the output signal will be constrained to twice this limiting voltage. Practical considerations will even further limit this, since the highest power switching elements are quite expensive and may not be cost effective in many applications.

FIG. 3 illustrates another embodiment of the invention, not limited in the amplitude of voltage which may be provided at the output thereof. In this embodiment, as in the embodiment of FIGS. 1 and 2, an amplifier 98 is provided including a circuit 100 for converting the incoming analog signal into a multibit digital representation thereof. In this embodiment, the circuit 100 will comprise any of the conventionally available "level detector" circuits such as the Texas Instruments TL490 or others. This level detector, contrary to the A/D convertor of FIG. 1, does not include outputs which are differently weighted. Instead, each of the outputs represents an equivalent voltage increment, with the total voltage range representable by this circuit equaling this voltage increment times the number of outputs. When the instantaneous level of the input signal is at the lowest level representable by the level detector (i.e., negative full scale), all of the output lines of the level detector will be low. If the input signal is then steadily increased, the number of high output lines will also steadily increase until the input signal reaches the highest level representable by the level detector (i.e., positive full scale), when all of the outputs will be high. Of course, the D.C. level of the input signal will normally be biased halfway between positive and negative full scale.

As previously, the output of the circuit 100 is directed to a reconstruction circuit having a plurality of cells 102, with each cell including an incremental voltage source 104, the solid state switch 106, and a bypassing diode 108. In this embodiment, contrary to previous embodiments, each of the incremental voltages 104 provides an output voltage which is substantially equal to the output voltages provided by each of the other incremental voltage sources. This is possible because the outputs of the level detector 100 are equally weighted, rather than being coded in binary, BCD, or other fashion, as with the embodiments of FIGS. 1 and 2. Each of the incremental voltages 104 will thus have a value equal to the smallest incremental change required. The incremental voltages will therefore not be large enough to introduce difficulties associated with limiting operating voltages of the solid state switches used therewith.

The number of incremental voltage steps, however, will of course be much greater than that in the embodiments illustrated in FIGS. 1 and 2, since one incremental voltage source must be provided for each of the possible voltage steps. In other words, if 256 different levels of output signals are desired, then 256 different amplifier cells must be provided. The complexity of the circuit may be reduced by reducing the number of cells, however this reduces the number of possible voltage steps available and limits the resolution of the reconstructed waveform.

In the embodiment of FIG. 3, the competing constraints of signal resolution and system complexity are resolved by providing an additional amplifier stage 110 is series with the amplifier cells 102. This amplifier stage 110 may be substantially identical to either the amplifier 14 illustrated in FIG. 1, the amplifier 62 illustrated in FIG. 2, or the amplifier 60 of FIG. 2, representing the series combination of amplifiers 14 and 62. By using the amplifier 14 of FIG. 1 in combination with the previously described amplifier cells 102, the number of incremental voltage sources 104 required for any given degree of signal resolution may be diminished by a factor of 16. This is because, between each sequential setting of the cells 102, 16 different voltage steps will be provided by various combinations of the four differently weighted cells in the amplifier 14. Even greater resolution will be achieved by utilizing the amplifier 60 in series with the amplifier 98. Whichever amplifier is used for stage 110, the various incremental voltage sources 104 associated with the amplifier 98 may be selected to have voltages approaching the practical and economic limits of the switching elements associated therewith, and resolution between these various incremental voltage steps will be accomplished by the amplifiers 16 and/or 62 of FIG. 2.

When an amplifier 110 is used in series with the amplifier 98, the voltage signal provided at the input of that auxiliary amplifier 110 must, again, represent the difference between the stepwise signal provided across the amplifier 98 and the desired waveform. In FIG. 3, this difference signal is again derived by dividing down the signal appearing across the amplifier 98 with a fixed resistor 111 and a potentiometer 112. A tap on the potentiometer 112 provides a signal which is subtracted from the input signal $V_n$ by a differential amplifier 114. Once more, as with the embodiment of FIG. 2, the amplifier stages 98 and 110 may be interchanged so that the amplifier 110 is located between the amplifier 98 and ground, and in this case the control signal to amplifier stage 110 will be derived in a different manner, such as the manner illustrated in FIG. 2A. If the technique of FIG. 2A is utilized, however, the resistors feeding the input to the current amplifier will of course have equal values, since the outputs of the level detector 100 are equally weighted.

Figure 4:
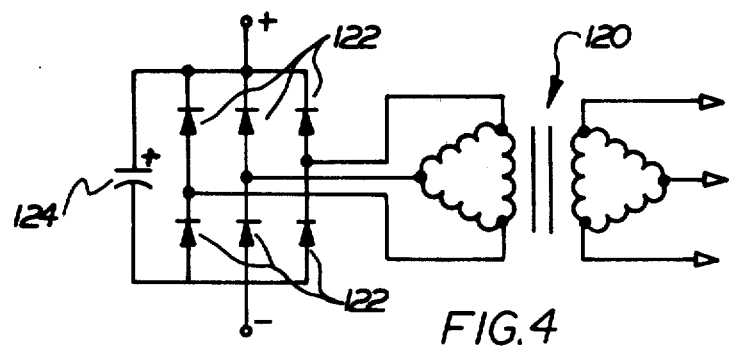
FIG. 4 is a circuit diagram of an incremental voltage source such as might be useful in the embodiments of FIGS. 1-3.
Figure 5:
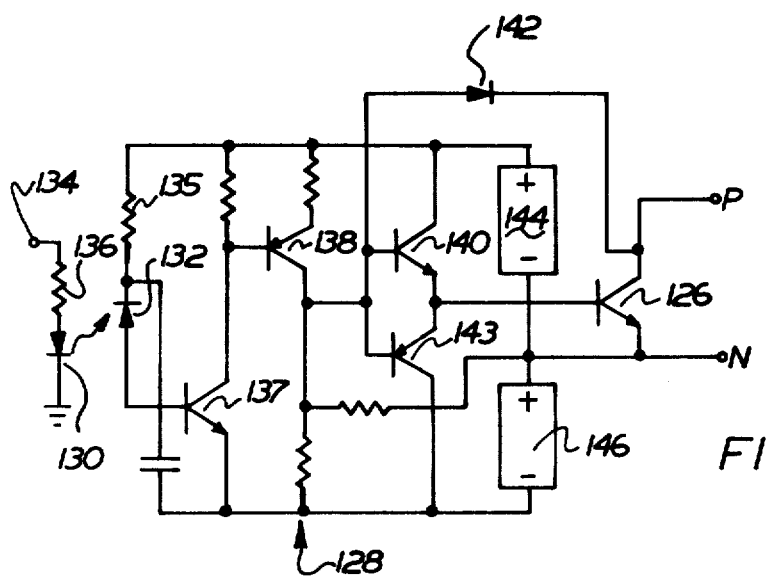
FIG. 5 is a schematic illustration of a switching circuit useful for switching the incremental power sources as required by the embodiments of FIGS. 1-3.

FIGS. 4 and 5, respectively, illustrate specific forms which the incremental power sources and solid state switching elements of the embodiments of FIGS. 1, 2 and 3 could take. Of course, any number of alternative embodiments are possible, and these embodiments are only set forth as examples.

Referring now to the circuitry of FIG. 4, an incremental power source is shown which consists essentially of a three-phase power transformer 120, six diodes 122 connected together to a conventional full wave three-phase rectifying circuit, and a filter capacitor 124. If desired, regulating elements may be included to further stabilize the voltage provided at the output of the incremental voltage source, rather than directly taking the output of the filter capacitor 124. It will be noted that, due to the isolation provided by the transformer 120, the voltage appearing across the filter capacitor 124 will float with respect to earth ground and also with respect to the other incremental voltage sources.

FIG. 5 illustrates one form which the switching circuits could take. In FIG. 5, a high power transistor 126 is used for switching the incremental voltage source, with the remainder of the circuitry illustrated in FIG. 5 being utilized to drive this transistor 126. When connected in with an amplifier cell as shown in any of the previous figures, the collector connection P will be connected to the positive terminal on the associated incremental voltage source, whereas the emitter connection N will be connected to the cathode of the bypassing diode of that cell.

In FIG. 5, the driver circuit 128 is isolated from the control lines by means of a light emitting diode 130 and an optically coupled photo diode 132. When a high logic signal is applied to the input terminal 134, this voltage signal will be converted to a current by a resistor 136, with the current then passing through the diode 130. The diode 130 will emit light to the photo diode 132 which will respond by switching from a high impedance state to a low impedance state.

A fiber optic link may be provided between the LED 130 and the photo diode 132. A fiber optic link of this nature would be quite advantageous where the coding circuitry which produces the control signals is located at a physically remote location from the switching circuitry and incremental voltage sources. Thus, fiber optic links are not susceptible to electromagnetic noise, nor would they introduce reactance in the manner of conventional multi-conductor cables.

In any event, the application of a logic 1 signal to terminal 134 will cause the diode 132 to drop to a low impedance state, thereby permitting the current to flow through a resistor 135 and into the base of transistor 137. This, in turn, will turn on transistors 138 and 140, thereby switching "on" the output transistor 126. The amount of current drive provided to the output transistor 126 by transistor 140 is regulated by a "baker clamp" consisting of a diode 142. As transistor 126 drops toward saturation, a point is eventually reached at which the diode 142 becomes forward biased, thereby shunting base drive away from the transistor 140. If transistor 126 rises out of saturation, however, then diode 142 will become reversed biased, thereby increasing base drive to transistor 140 and again dropping the output transistor 126 into saturation.

When the voltage applied to terminal 134 drops to zero, the diode 132 will return to a high impedance state, thus switching off transistors 137, 138 and 140. Due to carrier storage in these transistors, however, the output transistor 126 might not turn off immediately were it not for the inclusion of an additional transistor 143. This transistor couples the base of the output transistor 126 to ground when transistor 138 switches off, thereby insuring that rapid, positive disablement of the output transistor 126 occurs.

The switching circuitry 128 thus described will be powered by positive and negative voltage supplies 144 and 146 which will be referenced to the terminal N in the fashion illustrated in FIG. 5. To permit this referencing, the power supplies 144 and 146 will be isolated from the AC power line by means of transformer coupling (not shown), as with the incremental power source of FIG. 4.

Although the invention has been described with respect to preferred embodiments, it will be appreciated that various rearrangements and alterations of parts may be made without departing from the spirit and scope of the invention, as defined in the appended claims. Thus, although voltage sources have been used as the incremental power sources in the specifically described embodiments, it will be appreciated that any other appropriate power sources (e.g., current sources) could instead be employed.

What is claimed is:

1. A high power amplifier comprising means responsive to an amplitude and frequency varying input signal to provide a digital representation thereof, a plurality of signal sources each providing an associated power signal, said signal sources providing independent said signals such that desired combinations of said power signals can be combined to form a combined signal, and means for combining selected ones of said associated signals in accordance with said digital representation to provide a first combined signal which varies in accordance with said input signal.

2. An amplifier as set forth in claim 1, wherein said means for providing said digital representation comprises means responsive to said amplitude and frequency varying input signal to provide a digital representation including plural bilevel bits, with the number of said bits at a given one of said bilevels being substantially proportional to the level of said amplitude and frequency varying input signal.

3. An amplifier as set forth in claim 2, wherein said plurality of signal sources each provide a substantially equal signal level.

4. An amplifier as set forth in claim 1, wherein said means for providing said digital representation comprises means responsive to said input signal to provide a binary coded digital word including plural bilevel bits, with the binary coded value of said word substantially following the waveform of said input signal.

5. An amplifier as set forth in claim 4, wherein each of said signal sources provides a signal having a value proportional to the value associated with the bit position of a corresponding one of said bits in said digital word.

6. An amplifier as set forth in claim 1, wherein said plurality of selectable signal sources comprises a corresponding plurality of incremental voltage sources each providing a substantially fixed incremental voltage, and wherein said means for combining comprises means for connecting selected ones of said voltage sources in series to provide said first combined signal, said ones being selected by corresponding bits of said digital representation.

7. An amplifier as set forth in claim 6, wherein said connecting means comprises a plurality of switching means, each associated with a corresponding one of said incremental voltage sources and having at least two selectable states, in the first of which said associated incremental voltage source is selected and is interconnected in series with any other selected voltage sources to provide said first combined signal and in the other of which said associated incremental voltage source is disconnected from the selected voltage sources, with the state of each of said switching means being selected by a corresponding bit of said representation.

8. An amplifier as set forth in claim 1, wherein each said signal source comprises a D.C. voltage source.

9. An amplifier as set forth in claim 8, wherein each said D.C. voltage source comprises transformer means responsive at its input to at least one A.C. power signal to provide at least one corresponding A.C. power signal on its output, said output A.C. power signal floating with respect to said input A.C. power signal, and means responsive to said output A.C. power signal for deriving a D.C. power signal therefrom, said D.C. power signal floating with respect to said input A.C. power signal and also with respect to the D.C. power signals provided by other said signal sources, where said D.C. power signals represent said power signals associate,d with said signal sources.

10. An amplifier comprising means responsive to an amplitude and frequency varying input signal to provide a digital representation thereof, a plurality of signal sources each providing an associated signal, and means for combining selected ones of said associated signals in accordance with said digital representation to provide a first combined signal having substantially the same waveform as, but of greater amplitude than, said input signal, wherein said means for providing said digital representation comprises means responsive to said amplitude and frequency varying input signal to provide a binary coded digital word including plural bilevel bits, with the binary coded value of said word substantially following the waveform of said amplitude and frequency varying input signal, and further comprising means for providing an error signal in accordance with the difference between the desired and actual forms of said first combined signal, and means for combining said error signal with said first combined signal to provide an error corrected first combined signal.

11. An amplifier as set forth in claim 10, wherein said means for providing said error signal comprises means for providing a PDM signal modulated in accordance with said difference, said PDM signal serving as said error signal.

12. An amplifier comprising means responsive to an amplitude and frequency varying input signal to provide a digital representation thereof, a plurality of signal sources each providing an associated signal, and means for combining selected ones of said associated signals in accordance with said digital representation to provide a first combined signal having substantially the same waveform as, but of greater amplitude than, said input signal, and further comprising at least one further selectable signal source, and means for proportioning the amount of time that the signal of said further signal source is combined with said first combined signal in accordance with the difference between the actual and desired forms of said first combined signal.

13. An amplifier as set forth in claim 12, wherein said proportioning means comprises means for providing a feedback signal corresponding to said first combined signal but of reduced amplitude, and means for controlling the proportion of time that the signal of said further signal source is combined with said first combined signal in accordance with the difference between said feedback signal and said input signal.

14. An amplifier responsive to an input signal to provide an amplified said signal to a load connected across the output of said amplifier, comprising a plurality of floating voltage sources each providing a corresponding voltage signal which floats relative to the voltage signals provided by the other sources, and means for connecting selected ones of said voltage sources in series across said output of said amplifier in accordance with the level of said input signal whereby a voltage signal is applied to said output which is the additive sum of said selected voltage signals, said connecting means selecting said voltage sources so that said voltage signal applied to said output varies in a desired fashion with variations in said input signal.

15. An amplifier as set forth in claim 14, wherein each of said floating voltage sources provides a corresponding D.C. voltage signal which floats relative to the voltage signals provided by the other sources.

16. An amplifier as set forth in claim 14, wherein each of said floating voltage sources comprises a D.C. power supply for converting an applied A.C. power signal into a D.C. power signal which floats with respect to said A.C. power signal, wherein said D.C. power signal serves as said voltage signal provided by said voltage source.

17. An amplifier responsive to an amplitude and frequency varying input signal to provide an amplified said signal to a load connected across the output of said amplifier, comprising a plurality of incremental voltage sources each providing a substantially fixed incremental voltage, and means for connecting selected ones of said voltage sources in series across said output of said amplifier in accordance with the level of said amplitude and frequency varying input signal whereby a voltage signal is applied to said output which is the additive sum of said selected incremental voltages, said connecting means selecting said incremental voltage sources so that said voltage signal applied to said output corresponds to said amplified input signal, and further comprising means for providing an error signal in accordance with the difference between the forms of said first voltage signal and said input signal, and means for combining said error signal with said voltage signal to provide an error corrected voltage signal.

18. An amplifier as set forth in claim 17, wherein said means for providing said error signal comprises means for providing a PDM signal modulated in accordance with said difference, said PDM signal serving as said error signal.

19. An amplifier responsive to an amplitude and frequency varying input signal to provide an amplified said signal at the output thereof, comprising:
converter means responsive to said amplitude and frequency varying input signal to provide a digital word including plural bits which together indicate and change with the level of said amplitude and frequency varying input signal, each of said bits having a value associated with its bit position in said digital word; and
means responsive to said digital word for providing an output signal which varies in a desired fashion with variations in said input signal, said means comprising a plurality of floating voltage sources, each providing a voltage signal having a value related to the value associated with one of said bit positions in said digital word, and a plurality of switching means, each associated with a corresponding one of said voltage sources, each said switching means having at least two selectable states, in the first of which said associated incremental voltage source is selected and is interconnected in series with any other selected voltage sources across said output, and in the other of which said associated incremental voltage source is disconnected from said output, with the state of each said switching means being selected by the bit in the corresponding said bit position.

20. An amplifier as set forth in claim 19 wherein said converter means comprises means responsive to said input signal to provide a digital word including plural bits, with the number of said bits at a given logic level being proportional to the analog level of said input signal to within predetermined limits, and wherein said plurality of incremental voltage sources each provide a substantially equal increment of voltage, whereby the voltage across said output is similarly proportional to said input signal.

21. An amplifier as set forth in claim 19, wherein said converter means comprises analog to digital converter means responsive to said input signal to provide a binary coded digital word including plural bits, with the binary coded value of said word being proportional to the level of said input signal to within predetermined limits, and wherein the voltage increments provided by the said incremental voltage sources corresponding to said bits fall within a binary progression corresponding to the binary progression of said binary coded word.

22. An amplifier responsive to an amplitude and frequency varying input signal to provide an amplified said signal at the output thereof, comprising:
converter means responsive to said amplitude and frequency varying input signal to provide a digital word including plural bits which together indicate and change with the level of said amplitude and frequency varying input signal, each of said bits having a value associated with its bit position in said digital word; and
means responsive to said digital word for reconstructing said input signal in amplified form, said means comprising a plurality of incremental voltage sources, each having a value corresponding to the value associated with one of said bit positions in said digital word, and a plurality of switching means, each associated with a corresponding one of said incremental voltage sources, each said switching means having at least two selectable states, in the first of which said associated incremental voltage source is selected and is interconnected in series with any other selected voltage sources across said output, and in the other of which said associated incremental voltage source is disconnected from said output, with the state of each said switching means being selected by the bit in the corresponding said bit position;
and further comprising at least one further incremental voltage source and associated switching means, and means for controlling said associated switching means and thus the interconnection of said at least one further incremental voltage source in series with said other selected voltage sources, said controlling means comprising means for providing an error signal responsive to the difference between the actual and desired forms of the voltage across the series combination of said other selected voltage sources, and means for selecting the state of said associated switching means in accordance with said error signal.

23. An amplifier as set forth in claim 22, wherein said means for selecting the state of said associated switching means comprises modulating means for providing a modulated signal having at least first and second levels wherein the proportion of time that said signal is at one of said levels is modulated in accordance with said error signal, said associated switching means responding to said first and second levels of said signal to switch to corresponding ones of said two selectable states.

24. An amplifier as set forth in claim 23 wherein said modulating means comprises a pulse duration modulator, whereby said modulated signal comprises a pulse duration modulated signal.

25. An amplifier responsive to an amplitude and frequency varying input signal to provide an amplified said signal, comprising:
means responsive to said input signal to provide a digital word including plural bits which together indicate and change with the level of said input signal,
means responsive to said changing digital word for providing an incrementally varying signal which approximates the instantaneous level of an amplified said input signal to within a fixed incremental limit,
means for providing an error signal indicative of the difference between said incremental signal and an amplified said input signal, means responsive to said error signal for providing a modulated signal switching between at least first and second levels and for modulating the proportion of time that said modulated signal is at one of said levels in accordance with said error signal, and means for combining said modulated signal and said incremental signal to provide an amplified said input signal.

26. An amplifier as set forth in claim 25, wherein said means for providing said error signal comprises means responsive to a signal which varies between at least first and second levels in accordance with said difference, wherein the difference between said levels substantially corresponds to said fixed incremental limit.

27. An amplifier as set forth in claim 25, wherein said means for combining said modulated signal and said incremental signal comprises means for additively combining said modulated and incremental signals to provide a sum signal, and means for filtering said sum signal to remove high frequency components therefrom introduced at least by the switching of said modulated signal between said first and second levels.

28. An amplifier as set forth in claim 25, wherein said means for providing said incrementally varying signal comprises a plurality of incremental voltage sources, each having a value corresponding to the value associated with at least one corresponding bit of said digital word, and a plurality of switching means for selectively interconnecting said incremental voltage sources, each said switching means being associated with a corresponding incremental voltage source and controlled by said at least one corresponding bit of said digital word to either interconnect the corresponding incremental voltage source in series with other selected incremental voltage sources or to disconnect it therefrom, wherein said incremental signal is the signal appearing across the series combination of all of the selected ones of said incremental voltage sources.

29. An amplifier as set forth in claim 25, wherein said means for providing said digital word comprises an analog-to-digital convertor.

30. An amplifier as set forth in claim 25, wherein said means for providing said digital word comprises a level detector providing a said digital word wherein the number of bits at a given logic level is substantially proportional to the analog level of said amplitude and frequency varying input signal.

31. An amplifier responsive to an amplitude and frequency varying input signal to provide a first signal corresponding to said input signal but of greater magnitude, comprising:
a plurality of first incremental voltage sources, each providing a first substantially fixed voltage signal,
means responsive to said input signal to connect a number of said voltage sources in series to provide an output signal, said number being substantially proportional at any given time to the level of said input signal, whereby the voltage across said series connected voltage sources generally follows said input signal but is of greater amplitude and corresponds to said first signal to within a given error,
means for providing a correction signal in accordance with the extent to which said voltage across said series connected voltage sources differs from said first signal, said correction signal being such that, when combined with said voltage across said series connected voltage source, it will tend to reduce said difference in the combined signal, and
means for combining said correction signal with said voltage across said series connected voltage sources to thereby provide said first signal.

32. An amplifier as set forth in claim 31, wherein said means for providing said correction signal comprises error detector means for providing an error signal varying in accordance with the extent to which said voltage across said series connected voltage sources differs from said first signal, and means for providing a pulse duration modulated signal modulated in accordancce with said error signal and serving as said correction signal.

33. An amplifier as set forth in claim 32 wherein said means for combining comprises means for summing said pulse duration modulated signal with said voltage across said series connected voltage sources and means for filtering the resulting sum signal to eliminate high frequency components therefrom introduced by the switching of said pulse duration modulated signal.

34. An amplifier as set forth in claim 31, wherein said means for providing said correction signal comprises error detection means for providing an error signal which varies with the difference between said voltage across said series connected voltage sources and said first signal, analog-to-digital convertor means responsive to said error signal to provide a second digital word including plural bilevel bits, with the binary coded value of said word being at any given time substantially proportional to the level of said error signal, a plurality of second incremental voltage sources each corresponding to an associated one of said bits of said second word, the relative magnitudes of the incremental voltages provided by said second incremental voltage sources corresponding to the relative binary coded values of the bits positions of the corresponding bits in the second digital word, and means for connecting selected ones of said second incremental voltage sources together in series, said sources being selected in accordance with the level of the corresponding said bits of said second word and wherein the voltage across said series connected second voltage sources serves as said correction signal.

35. An RF amplitude modulation system comprising means for providing an RF carrier signal, means for providing a modulating signal, means for amplifying said modulating signal to provide an amplified modulating signal, and means for amplitude modulating said carrier signal with said amplified modulating signal, wherein said amplifying means comprises signal level detector means responsive to said modulating signal to provide a digital word including plural bits which together indicate and change with the instantaneous level of said modulating signal, said bits each having first and second discrete logic values, where at any given time the number of said bits at said first logic value is substantially proportional to the instantaneous level of said modulating signal, a plurality of amplifier cells connected in series and each controlled by at least one corresponding said bit of said digital word, each said cell sourcing a substantially fixed level voltage signal thereacross when said at least one bit has a first logic value, and having a low impedance and substantially no voltage signal thereacross otherwise, whereby the signal appearing across the series combination of all of said cells represents an amplified incremental approximation of said modulating signal, and filtering means for filtering said amplified incremental approximation of said modulating signal to provide a filtered said signal serving as said amplified modulating signal.

36. An RF amplitude modulation system as set forth in claim 35, wherein each said cell comprises bypassing means for providing a unidirectional current path, said bypassing means being connected in series with the other amplifier cells and in parallel with the series connected combination of a floating voltage source providing a first voltage signal and a solid state switching means controlled by said corresponding bit of said digital word, said switching means having low impedance when said bit has said first value and a high impedance otherwise, whereby said first voltage signal is applied across said unidirectional current shunting means when said bit has said first value, and further wherein said bypassing means is poled to block current flow from said floating voltage source.

37. An amplifier comprising:
a plurality of sources providing substantial constant electrical outputs;
means, receiving audio input signals, for converting said audio signals into digital signals representative of the amplitude of said audio signals,
means responsive to said digital signals for connecting together various ones of said plurality of sources to reproduce an output analog signal representative of said audio signal, in amplified form; and
filter means for filtering said output analog signal to substantially reproduce said input analog signal in amplified form.

38. An amplifier comprising:
a plurality of sources providing substantial constant electrical outputs;
means, receiving audio input signals, for converting said audio signals into digital signals representative of the amplitude of said audio signals;
means responsive to said digital signals for connecting together various ones of said plurality of sources to reproduce an output analog signal representative of said audio signal, in amplified form;
filter means for filtering said output analog signal to substantially reproduce said input analog signal in amplified form;
means for providing an error signal in accordance with the difference in waveform between said input and output signals; and,
means for combining said error signal with said output signal to provide an error-corrected output signal.

39. A power amplifier comprising:
plural power sources, each providing an output signal when actuated and no output signal otherwise;
means for combining the output signals provided by said plural power sources to provide a combined output signal; and,
means for actuating combinations of said plural power sources in accordance with the value of an input signal, said value representing the instantaneous amplitude of an amplitude and frequency varying analog signal, so as to thereby cause said combined output signal to vary as a function of said input signal.

40. An amplifier as set forth in claim 39, wherein said input signal is itself the analog signal.

41. An amplifier as set forth in claim 39, wherein said means for combining comprises means for connecting said plural power sources together in series.

42. An amplifier as set forth in claim 39, wherein each of said power sources provides a D.C. voltage signal thereacross when actuated, and no voltage thereacross otherwise.

43. A power amplifier comprising:
plural power sources, each controllable to be in a selected one of two states, wherein each source provides an output signal when in one state and no output signal when in another state;
means for combining the output signals provided by said plural power sources to provide a combined output signal; and,
means for controlling the states of said plural power sources in accordance with the value of an input signal, said value representing the instantaneous amplitude of an amplitude and frequency varying analog signal, so as to thereby cause said combined output signal to vary as a function of said input signal,
wherein said combining means comprises means for connecting said plural power sources together in series, and wherein each power source comprises bypassing means providing a low impedance unidirectional current path through said power source, said bypassing means being connected in series with the other power sources and in parallel with the series-connected combination of a floating voltage source providing a first voltage signal and a solid state switching means having a low impedance state and a high impedance state, whereby said first voltage signal is applied across said unidirectional current shunting means when said switching means is in said low impedance state and further wherein said bypassing means is poled to block current flow from said floating voltage source.

44. An amplifier as set forth in claim 43, wherein said means for controlling the states of said plural power sources comprises means for providing a digital representation of an analog signal, said digital representation including plural binary bits whose logic states vary in accordance with the instantaneous amplitude of said analog signal, each said binary bit controlling the state of a switching means of an associated power source.

45. An amplifier as set forth in claim 44, wherein said means for providing a digital representation of an analog signal comprises an analog to digital converter.

46. An amplifier for providing an amplified output signal representative of an amplitude and frequency varying input signal, said amplifier comprising in combination:
first means for providing at outputs thereof binary signals which in combination are representative of the instantaneous amplitude of said amplitude and frequency varying input signal, and
a plurality of power sources having inputs responsive to binary signals for controlling the signals provided by said sources, said inputs being coupled to said outputs of said first means, and having outputs thereof operatively coupled together such that the signal resulting from the combination of said multiple power sources is a representation of said amplitude andd frequency varying input signal.

47. An RF amplitude modulation system comprising means for providing an RF carrier signal, means for providing a modulating signal, and means for amplitude modulating said carrier signal with said modulating signal, wherein said means for providing said modulating signal comprises means for receiving a digital word which includes plural bits that together indicate and change with the instantaneous level of an analog signal, said bits each having first and second discrete logic values, where the number of said bits at a given one of said first and second discrete logic values is substantially proportional to the instantaneous level of said analog signal, a plurality of amplifier cells connected in series and each controlled by at least one corresponding said bit of said digital word, each said cell sourcing a first substantially fixed level voltage signal thereacross when said at least one bit has a first logic value, and having a low impedance and substantially no voltage signal thereacross otherwise, whereby a modulating signal appears across the series combination of all of said cells which is an incremental approximation of an amplified said analog signal, and means for operatively coupling said series combination of amplifier cells to said amplitude modulating means.

48. An RF amplitude modulation system as set forth in claim 47, wherein each said amplifier cell comprises bypassing means for providing a unidirectional current path, said bypassing means being connected in series with the other amplifier cells and in parallel with the series connected combination of a floating voltage source providing a first voltage signal and a solid state switching means controlled by said corresponding bit of said digital word, said switching means having low impedance when said bit has said first value and a high impedance otherwise, whereby said first voltage signal is applied across said unidirectional current shunting means when said bit has said first value, and further wherein said bypassing means is poled to block current flow from said floating voltage source.

* * * * *